(12) United States Patent
Liu et al.

(10) Patent No.: US 10,885,948 B1
(45) Date of Patent: Jan. 5, 2021

(54) NAND FLASH CONTROLLING SYSTEM AND METHOD THEREOF

(71) Applicant: ATP ELECTRONICS TAIWAN INC., Taipei (TW)

(72) Inventors: Jyun-Nan Liu, Taipei (TW); Chih-Wei Ho, Taipei (TW); Hung-Tse Lin, Taipei (TW)

(73) Assignee: ATP ELECTRONICS TAIWAN INC., Taipei (TW)

( * ) Notice: Subject to any disclaimer, the term of this patent is extended or adjusted under 35 U.S.C. 154(b) by 0 days.

(21) Appl. No.: 16/774,622

(22) Filed: Jan. 28, 2020

(30) Foreign Application Priority Data

Dec. 3, 2019 (TW) .............................. 108144050 A

(51) Int. Cl.
| | |
|---|---|
| *G11C 11/34* | (2006.01) |
| *G11C 7/04* | (2006.01) |
| *G11C 16/02* | (2006.01) |
| *G11C 29/42* | (2006.01) |
| *G11C 7/10* | (2006.01) |

(52) U.S. Cl.
CPC .............. *G11C 7/04* (2013.01); *G11C 7/1057* (2013.01); *G11C 16/02* (2013.01); *G11C 29/42* (2013.01)

(58) Field of Classification Search
CPC ......... G11C 7/04; G11C 7/1057; G11C 16/02; G11C 29/42
USPC .................................................. 365/185.17
See application file for complete search history.

(56) References Cited

U.S. PATENT DOCUMENTS

| | | | | |
|---|---|---|---|---|
| 8,213,255 | B2 * | 7/2012 | Hemink | G11C 16/26 365/211 |
| 9,224,457 | B2 | 12/2015 | Hemink et al. | |
| 9,928,126 | B1 * | 3/2018 | Shappir | G06F 11/108 |
| 2014/0325122 | A1 * | 10/2014 | Kim | G06F 1/206 711/103 |
| 2014/0347936 | A1 * | 11/2014 | Ghaly | G11C 16/10 365/185.18 |
| 2015/0092488 | A1 * | 4/2015 | Wakchaure | G11C 7/04 365/185.03 |

(Continued)

FOREIGN PATENT DOCUMENTS

| | | |
|---|---|---|
| TW | I493553 B | 7/2015 |
| TW | I628666 B | 7/2018 |

*Primary Examiner* — Viet Q Nguyen
(74) *Attorney, Agent, or Firm* — Muncy, Geissler, Olds & Lowe, P.C.

(57) ABSTRACT

A NAND flash controlling method includes the steps of: configuring a temperature-sensing unit to detect the flash temperatures and a source block to store source data; configuring a main control unit to receive the flash temperatures for calculating a temperature difference, to generate a data-transmitting signal if the current temperature is abnormal and the temperature difference is too large; configuring a control unit to read and transmit the source data; configuring a data-buffering unit to receive and store the source data; configuring an error-correcting unit to receive a source error-correcting code and a source bit-error rate to re-calculate an updated error-correcting code; configuring a flash-buffering unit to receive the updated error-correcting code and the source data; and, configuring the control unit to utilize the updated error-correcting code to write the source data into the destination block from the flash-buffering unit. In addition, a NAND flash controlling system is also provided.

5 Claims, 3 Drawing Sheets

(56) References Cited

U.S. PATENT DOCUMENTS

| | | |
|---|---|---|
| 2016/0117216 A1* | 4/2016 | Muchherla ............. G11C 16/10 |
| | | 714/6.11 |
| 2016/0239235 A1* | 8/2016 | Chung ............... G11C 16/0483 |
| 2017/0117053 A1* | 4/2017 | Sharon ............... G11C 16/3418 |
| 2017/0255403 A1* | 9/2017 | Sharon ................ G11C 11/5628 |
| 2017/0271031 A1* | 9/2017 | Sharon ................ G06F 11/3058 |
| 2017/0345510 A1* | 11/2017 | Achtenberg ........... G11C 29/52 |
| 2018/0129431 A1* | 5/2018 | Yang ...................... G11C 16/26 |
| 2018/0293029 A1* | 10/2018 | Achtenberg ........ G11C 11/5628 |
| 2018/0349243 A1* | 12/2018 | Shin ........................ G06F 1/206 |
| 2019/0129648 A1* | 5/2019 | Prabhu ..................... G11C 7/04 |
| 2019/0267054 A1* | 8/2019 | Thalaimalaivanaraj ..................... |
| | | G11C 29/42 |
| 2019/0277173 A1* | 9/2019 | Dean ...................... F01N 13/009 |
| 2019/0278510 A1* | 9/2019 | Kaynak ................ G06F 3/0659 |
| 2019/0295665 A1* | 9/2019 | Kojima ................... G11C 7/04 |
| 2019/0369685 A1* | 12/2019 | Chang ................ G11C 16/3495 |
| 2019/0371412 A1* | 12/2019 | Lee ........................ G06F 3/0653 |
| 2020/0073451 A1* | 3/2020 | Nowell ................. G06F 1/3296 |
| 2020/0073592 A1* | 3/2020 | Nishikawa ............ G11C 16/26 |
| 2020/0133510 A1* | 4/2020 | Koudele ................. G11C 7/04 |
| 2020/0142799 A1* | 5/2020 | Hiruta ..................... G11C 7/04 |

* cited by examiner

NAND FLASH CONTROLLING SYSTEM AND METHOD THEREOF

This application claims the benefit of Taiwan Patent Application Serial No. 108144050, filed Dec. 3, 2019, the subject matter of which is incorporated herein by reference.

BACKGROUND OF THE INVENTION

(1) Field of the Invention

The invention relates to a system and a method for the system, and more particularly to a NAND flash controlling system and a method thereof.

(2) Description of the Prior Art

Generally speaking, the memory can be classified into a volatile memory or a non-volatile memory, in which the non-volatile memory is further classified into a ROM (Read only memory) or a Flash (flash).

The flash is further classified a NOR flash or a NAND flash. In comparison with the NAND flash, the NOR flash is applied earlier and read faster. Yet, the writing rate of the NOR flash is slower, and the cost thereof is higher. Thus, thanks to the faster writing rate and the lower cost, the NAND flash is much more popular and widely used. For example, most of the USB hard discs and smartphone memories are products of NAND flash.

Nevertheless, while the NAND flash transfers data, error may be accumulated due to direct writing without re-calculating error correcting codes (ECC); i.e., the number of bits for error data would keep rising. When the number of bits for error data rises to a significant degree, the data would be incorrect permanently since the corresponding error correcting code cannot be repaired anymore. In particular, while the NAND flash is operated within a wide temperature range (−20° C.~70° C.), error data usually happen to the high temperature region (higher than 40° C.) and the low temperature region (lower than −10° C.). Thus and definitely, the conventional NAND flash needs to be improved.

SUMMARY OF THE INVENTION

In view that the conventional NAND flash usually meets data error situations while being operated within the wide temperature range, accordingly it is an object of the present invention to provide a NAND flash controlling system and a method thereof for resolving at least part of problems in the art.

In this invention, the NAND flash controlling system includes a NAND flash module and a main control module. The NAND flash module includes a temperature-sensing unit, a source block, a control unit, a flash-buffering unit and a destination block. The main control module, connected signally with NAND flash module, includes a main control unit, a data-buffering unit and an error-correcting unit.

The temperature-sensing unit is configured for detecting a flash temperature for each preset time increment. The source block is configured for storing a source data having a source error-correcting code. The control unit, connected signally with the source block, is configured for reading and further transmitting the source data from the source block upon when a data-transmitting signal is received, and a source bit-error rate for the source data is increased with each of reading the source data. The flash-buffering unit, connected signally with the control unit and the source block, is configured for receiving an updated error-correcting code and the source data. The destination block is connected signally with the flash-buffering unit.

The main control unit, is configured for capturing the flash temperature, for defining a new detected flash temperature as a current temperature and a previous detected flash temperature as a previous temperature, for calculating a temperature difference, configured for generating a data-transmitting signal upon when the temperature difference is larger than a threshold value and the current temperature is within an abnormal temperature state, and for transmitting the data-transmitting signal to the control unit. The data-buffering unit is configured for receiving and further storing the source data. The error-correcting unit, connected signally with the data-buffering unit is configured for receiving the source error-correcting code and the source bit-error rate to re-calculate the updated error-correcting code. The abnormal temperature state stands for a temperature being not less than 40° C. or not more than −10° C. The control unit applies the updated error-correcting code to write the source data into the destination block from the flash-buffering unit.

In one embodiment of the present invention, the main control module further includes a time unit for calculating the preset time increment, a trigger signal is generated upon when each preset time increment is met, and the flash temperature detected by the temperature-sensing unit is captured upon when the main control unit receives the trigger signal.

In another aspect of the present invention, a NAND flash controlling method, includes: a step (a) of configuring the temperature-sensing unit to detect the flash temperature for each preset time increment, defining the new detected flash temperature as the current temperature and the preceding detected flash temperature as the previous temperature, and configuring the source block to store the source data having the source error-correcting code; a step (b) of configuring the main control unit to receive the current temperature and the previous temperature so as to calculate the temperature difference, further to determine whether or not the current temperature is within the abnormal temperature state upon when the temperature difference is larger than the threshold value, and to generate the data-transmitting signal if a determination is positive; a step (c) of configuring the control unit to read the source data from the source block and further to transmit the source data; a step (d) of configuring the data-buffering unit to receive and further store the source data; a step (e) of configuring the error-correcting unit to receive the source error-correcting code and the source bit-error rate to re-calculate the updated error-correcting code; a step (f) of configuring the flash-buffering unit to receive the updated error-correcting code and the source data; and, a step (g) of configuring the control unit to utilize the updated error-correcting code to write the source data into the destination block from the flash-buffering unit.

In one embodiment of the present invention, prior to the step (a), the NAND flash controlling method further includes a step (h) of configuring a time unit to calculate the preset time increment.

In one embodiment of the present invention, upon when the determination of the aforesaid step (b) is negative, the method further includes: a step (i) of configuring the control unit to read and further transmit the source data from the source block; a step ( ) of configuring the flash-buffering unit to receive and further store the source data; and, a step (k)

of configuring the control unit to write the source data directly into the destination block from the flash-buffering unit.

As stated, the NAND flash controlling system as well as the method thereof provided in this invention can configure the temperature-sensing unit to detect the flash temperature, and configure the main control unit to evaluate the for further judging whether or not the temperature difference is larger than the threshold value and whether or not the flash temperature is within the specific temperature range. If the temperature difference is larger than the threshold value and the flash temperature is located within the specific temperature range, it implies that the NAND flash module is in a state of occurring error data. At this time, the source data would be transmitted to the data-buffering unit, and the error-correcting unit is applied to re-calculate the updated error-correcting code. Finally, the control unit is applied to utilize the updated error-correcting code to write the source data into the destination block from the flash-buffering unit. Thereupon, increasing of error bits caused by the temperature hike can be substantially slowed down, or evenly stopped.

All these objects are achieved by the NAND flash controlling system and the method thereof described below.

BRIEF DESCRIPTION OF THE DRAWINGS

The present invention will now be specified with reference to its preferred embodiment illustrated in the drawings, in which.

DESCRIPTION OF THE PREFERRED EMBODIMENT

The invention disclosed herein is directed to a NAND flash controlling system and a method thereof. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

Figure 1:
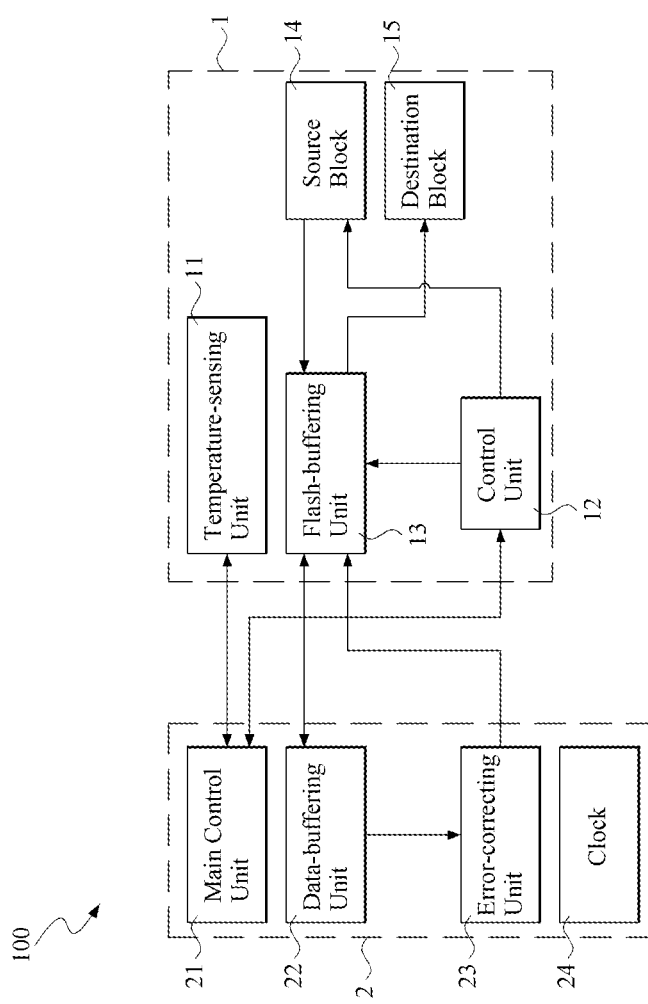
FIG. 1 is a schematic block view of the preferred NAND flash controlling system in accordance with the present invention.
Figure 2A:
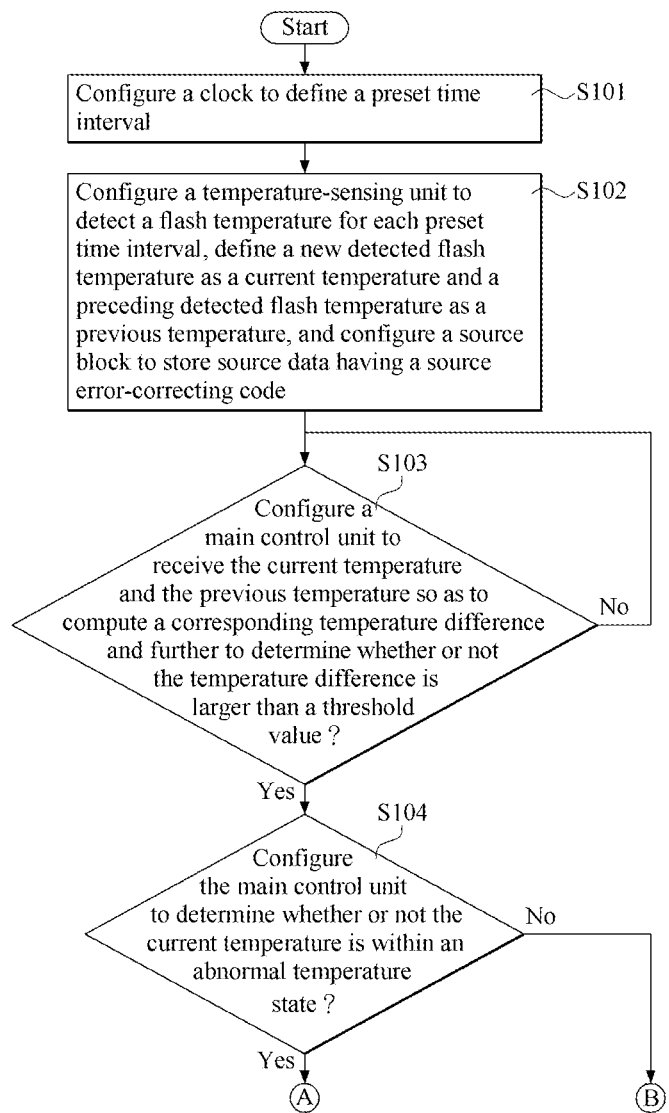
FIG. 2A and FIG. 2B integrally show the preferred NAND flash controlling method in accordance with the present invention.
Figure 2B:
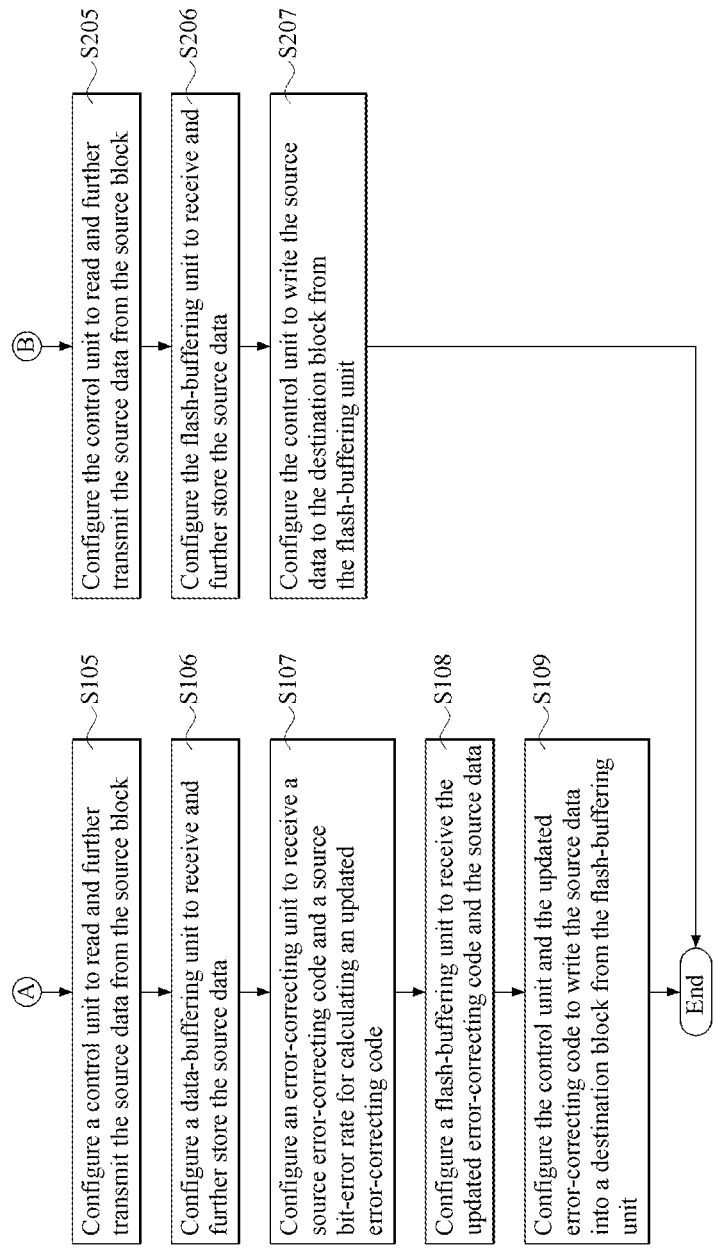

Refer to FIG. 1 through FIG. 2B; where FIG. 1 is a schematic block view of the preferred NAND flash controlling system in accordance with the present invention, and FIG. 2A and FIG. 2B integrally show the preferred NAND flash controlling method in accordance with the present invention. As shown, the NAND flash controlling system 100 includes a NAND flash module 1 and a main control module 2.

NAND flash module 1 includes a temperature-sensing unit 11, a control unit 12, a flash-buffering unit 13, a source block 14 and a destination block 15.

The main control module 2 includes a main control unit 21, a data-buffering unit 22 and a error-correcting unit 23. In this embodiment, the main control module 2 further includes a time unit 24.

The temperature-sensing unit 11 is configured for detecting a flash temperature of the NAND flash module 1. The time unit 24 is configured for calculating a preset time increment, and issues a trigger signal at each specific timing. In the embodiment, two consecutive specific timings can be spaced by a time increment such as 5 seconds, 10 seconds or 30 seconds. Preferably, the time increment can be a fixed or constant time increment, or named as a preset time increment. As soon as the main control unit 21 receives a trigger signal, it would respond to capture a flash temperature from the temperature-sensing unit 11. In other words, the main control unit 21 will collect all the flash temperatures detected at all specific timings. In this embodiment, whenever the temperature-sensing unit 11 detects the flash temperature, the new detected flash temperature would be defined as the current temperature, and simultaneously the preceding detected flash temperature would be shifted to be the previous temperature. Namely, the main control unit 21 would determine simultaneously the current temperature and the previous temperature for each predetermined or preset time increment.

In this embodiment, the main control unit 21 is to define the instant detected flash temperature as the current temperature, and the previous "current temperature" as the new "previous temperature". Then, the main control unit 21 would configure the instant current temperature and the instant previous temperature to calculate a corresponding temperature difference. In the case that the temperature difference is larger than a threshold value, a data-transmitting signal would be generated. In this embodiment, the threshold value can be, but not limited to, 20. In this embodiment, the main control unit 21 would calculate the temperature difference as an absolute value of the difference between the previous temperature and the current temperature.

Preferably, in the case that the main control unit 21 determines that the temperature difference is greater than the threshold value, it is further determined whether or not the current temperature is greater than 40° C. or smaller than −10° C. As the main control unit 21 determines that the current temperature is not less than 40° C. or not more than −10° C., it implies that, only if the current temperature is in the abnormal temperature state, the data-transmitting signal can be generated. It is noted that, in the art, error data would occur easier upon when the flash temperature is too high or too low.

After the control unit 12 receives the data-transmitting signal, as source data would be read and further transmitted from the source block 14. When the source data is stored into the source block 14, a source error-correcting code would be assigned thereto. Whenever the control unit 12 reads the source data, a source bit-error rate of the source data would increase. Namely, the higher the source bit-error rate is, the more the number of error bits would be. In this embodiment, the source would be transmitted to the flash-buffering unit 13 by the control unit 12.

The data-buffering unit 22 would receive and further store the source data from the flash-buffering unit 13, and the error-correcting unit 23 would receive the source error-correcting code and the source bit-error rate, so that an updated error-correcting code can be re-calculated by the error-correcting unit 23. Thereupon, accumulation and increase of error bits would be at least slowed down.

Further, after the source data is corrected through amending the source error-correcting code, then correct source data can be obtained. However, if the current temperature is within the abnormal temperature state, the source bit-error rate would be increased, and so is the number of error bits. At this time, the source error-correcting code might not be able to fix all the error bits, and thus correct source data would be hard to be obtained. Then, the error-correcting unit 23 would re-calculate a corresponding updated error-correcting code to compensate variation caused by the increase in temperature. With this updated error-correcting code, increasing of the source bit-error rate and the number of error bits can be substantially resolved.

Then, the flash-buffering unit 13 would receive both the updated error-correcting code and the source data. Finally, the control unit 12 would configure the updated error-correcting code to write the source data into the destination block 15 from the flash-buffering unit 13, so that the bit-error rate of the source data can be reduced. As the bit-error rate of the source data is reduced, possibility of data error would be decreased.

In this disclosure, an embodiment of the NAND flash controlling method is applied to a system such as the NAND flash controlling system 100 of FIG. 1. Referring to FIG. 2A and FIG. 2B together as a whole, the NAND flash controlling method includes Step S101 to Step S109 as follows.

Step S101: Configure a time unit to define a preset time increment.

In this method, the time unit can configure the time unit 24 of FIG. 1.

Step S102: Configure a temperature-sensing unit to detect a flash temperature for each preset time increment, define a new detected flash temperature as a current temperature and a preceding detected flash temperature as a previous temperature, and configure a source block to store source data having a source error-correcting code.

In this method, the temperature-sensing unit and the source block can configure the temperature-sensing unit 11 and the source block 14 of FIG. 1.

Step S103: Configure a main control unit to receive the current temperature and the previous temperature so as to compute a corresponding temperature difference and further to determine whether or not the temperature difference is larger than a threshold value.

In this method, the main control unit can configure the main control unit 21 of FIG. 1. In Step S103, if the determination is positive, then the method goes to perform Step S104. On the other hand, if the determination of Step S103 is negative, then Step S103 is repeated till the method can go further to perform Step S104.

Step S104: Configure the main control unit to determine whether or not the current temperature is within an abnormal temperature state.

In this method, the main control unit 21 would further determine whether or not the current temperature is in the abnormal temperature state. If this determination is positive, it implies that the system is in a state of keeping the occurrence of error data, and then the method goes to perform Step S105. On the other hand, if the determination is negative, then Step S205 is performed. In this embodiment, the abnormal temperature state stands for a state of having a temperature to be not less that 40° C. or not more than −10° C.

Step S105: Configure a control unit to read and further transmit the source data from the source block.

In this method, the control unit can configure the control unit 12 of FIG. 1.

Step S106: Configure a data-buffering unit to receive and further store the source data.

In this method, the data-buffering unit can configure the data-buffering unit 22 of FIG. 1.

Step S107: Configure an error-correcting unit to receive a source error-correcting code and a source bit-error rate for calculating an updated error-correcting code.

In this method, the error-correcting unit can configure the error-correcting unit 23 of FIG. 1, and is configured to re-calculate the updated error-correcting code. Thereupon, significant accumulation and increase of error bits can be substantially avoided.

Step S108: Configure a flash-buffering unit to receive the updated error-correcting code and the source data.

In this method, the flash-buffering unit can configure the flash-buffering unit 13 of FIG. 1.

Step S109: Configure the control unit and the updated error-correcting code to write the source data into a destination block from the flash-buffering unit.

In this method, the destination block can configure the destination block 15 of FIG. 1. Finally, the control unit 12 would configure the updated error-correcting code to write the source data into the destination block 15 from the flash-buffering unit 13. According to this invention, the updated error-correcting code is introduced to resolve the problem of the increase in the source bit-error rate caused by the temperature hike, and to reduce the number of error bits. Thereupon, as the source bit-error rate increases to rise the number of error bits because of the temperature hike, the updated error-correcting code can be introduced to correct the error bits, such that correct source data can be provided.

In Step S104, if the determination is negative, then it implies that the current temperature is not located within the abnormal temperature state, and thus the method goes to perform Step S205 to Step S207 as follows.

Step S205: Configure the control unit to read and further transmit the source data from the source block.

Step S206: Configure the flash-buffering unit to receive and further store the source data.

Step S207: Configure the control unit to write the source data to the destination block from the flash-buffering unit.

Since the current temperature is not within the abnormal temperature state, it implies that the possibility of occurrence in error data is kept low. Hence, after the flash-buffering unit 13 stores the source data, the control unit 12 would write directly the source data stored in the flash-buffering unit 13 into the destination block 15, not into the data-buffering unit 22.

In summary, the NAND flash controlling system as well as the method thereof provided in this invention can configure the temperature-sensing unit to detect the flash temperature, and configure the main control unit to evaluate the for further judging whether or not the temperature difference is larger than the threshold value and whether or not the flash temperature is within the specific temperature range. If the temperature difference is larger than the threshold value and the flash temperature is located within the specific temperature range, it implies that the NAND flash module is in a state of occurring error data. At this time, the source data would be transmitted to the data-buffering unit, and the error-correcting unit is applied to re-calculate the updated error-correcting code. Finally, the control unit is applied to utilize the updated error-correcting code to write the source data into the destination block from the flash-buffering unit, such that increasing of error bits caused by the temperature hike can be stopped.

In comparison with the prior art, even though the access rate of the source data (including reading and writing) would be slow in the abnormal temperature state, yet the device and the method provided by the invention can effectively reduce the error possibility in the source data. It is understood that, with the error source data, a rapid access rate of the source data would be nonsense. Thus, in the abnormal temperature state, the present invention discards a resort to resolve the access rate of the source data, but introduce the device and the method as described above to reduce the possibility of occurring error data, such that correct source data can be provided.

While the present invention has been particularly shown and described with reference to a preferred embodiment, it will be understood by those skilled in the art that various changes in form and detail may be without departing from the spirit and scope of the present invention.

What is claimed is:

1. A NAND flash controlling system, comprising:
    a NAND flash module, including:
        a temperature-sensing unit, configured for detecting a flash temperature for each preset time increment;
        a source block, storing a source data having a source error-correcting code;
        a control unit, connected signally with the source block, configured for reading and further transmitting the source data from the source block upon when a data-transmitting signal is received, a source bit-error rate for the source data being increased with each of reading the source data;
        a flash-buffering unit, connected signally with the control unit and the source block, configured for receiving an updated error-correcting code and the source data; and
        a destination block, connected signally with the flash-buffering unit; and
    a main control module, connected signally with the NAND flash module, including:
        a main control unit, configured for capturing the flash temperature, defining a new detected flash temperature as a current temperature and a previous detected flash temperature as a previous temperature, configured for calculating a temperature difference, configured for generating a data-transmitting signal upon when the temperature difference is larger than a threshold value and the current temperature is within an abnormal temperature state, and configured for transmitting the data-transmitting signal to the control unit;
        a data-buffering unit, configured for receiving and further storing the source data; and
        an error-correcting unit, connected signally with the data-buffering unit, configured for receiving the source error-correcting code and the source bit-error rate to re-calculate the updated error-correcting code;
    wherein the abnormal temperature state stands for a temperature being not less than 40° C. or not more than −10° C.;
    wherein the control unit applies the updated error-correcting code to write the source data into the destination block from the flash-buffering unit.

2. The NAND flash controlling system of claim 1, wherein the main control module further includes a time unit for calculating the preset time increment, a trigger signal is generated upon when each the preset time increment is met, and the flash temperature detected by the temperature-sensing unit is captured upon when the main control unit receives the trigger signal.

3. A NAND flash controlling method, applied to the NAND flash controlling system of claim 1, comprising the steps of:
    (a) configuring the temperature-sensing unit to detect the flash temperature for each the preset time increment, defining the new detected flash temperature as the current temperature and the preceding detected flash temperature as the previous temperature, and configuring the source block to store the source data having the source error-correcting code;
    (b) configuring the main control unit to receive the current temperature and the previous temperature so as to calculate the temperature difference, further to determine whether or not the current temperature is within the abnormal temperature state upon when the temperature difference is larger than the threshold value, and generating the data-transmitting signal if a determination is positive;
    (c) configuring the control unit to read the source data from the source block and further to transmit the source data;
    (d) configuring the data-buffering unit to receive and further store the source data;
    (e) configuring the error-correcting unit to receive the source error-correcting code and the source bit-error rate to re-calculate the updated error-correcting code;
    (f) configuring the flash-buffering unit to receive the updated error-correcting code and the source data; and
    (g) configuring the control unit to utilize the updated error-correcting code to write the source data into the destination block from the flash-buffering unit.

4. The NAND flash controlling method of claim 3, wherein the NAND flash controlling system further includes a time unit, and, prior to the step (a), the NAND flash controlling method further includes a step (h) of configuring the time unit to calculate the preset time increment.

5. The NAND flash controlling method of claim 3, upon when the determination of the step (b) is negative, further including the steps of:
    (i) configuring the control unit to read and further transmit the source data from the source block;
    (j) configuring the flash-buffering unit to receive and further store the source data; and
    (k) configuring the control unit to write the source data directly into the destination block from the flash-buffering unit.

* * * * *